United States Patent
Oh et al.

(10) Patent No.: US 7,898,039 B2
(45) Date of Patent: Mar. 1, 2011

(54) NON-VOLATILE MEMORY DEVICES INCLUDING DOUBLE DIFFUSED JUNCTION REGIONS

(75) Inventors: Dong-Yean Oh, Seoul (KR); Jai-Hyuk Song, Seoul (KR); Chang-Sub Lee, Gyeonggi-do (KR); Chang-Hyun Lee, Gyeonggi-do (KR); Hyun-Jae Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 11/675,372

(22) Filed: Feb. 15, 2007

(65) Prior Publication Data

US 2008/0093648 A1    Apr. 24, 2008

(30) Foreign Application Priority Data

Oct. 19, 2006    (KR) ...................... 10-2006-0101949

(51) Int. Cl.
*H01L 21/70* (2006.01)
*H01L 29/76* (2006.01)

(52) U.S. Cl. ................ 257/390; 257/314; 257/E21.666

(58) Field of Classification Search ................... 257/49, 257/202, 213, 296, 315, 316, 324, 356, 390, 257/406, 758, 774, 200, 330, 262, 314, 225, 257/E21.209, E27.075, E27.076, E27.078, 257/E21.316, E21.645, E21.662–669, 261, 257/319, E29.3, E21.401, E27.104, 391, 257/E21.666, E21.667, E27.085; 438/128, 438/257, 258, 261, 264, 381, 621, 640; 365/185.28
See application file for complete search history.

(56) References Cited

U.S. PATENT DOCUMENTS 5,932,909 A    8/1999    Kato et al.

5,977,593 A    11/1999    Hara (Continued)

FOREIGN PATENT DOCUMENTS

CN    1841708 A    10/2006

(Continued)

OTHER PUBLICATIONS

Sze, Semiconductor Devices. Physics and Technology, 2002, John wiley & Sons, Inc., 2nd Edition, separate pages.*

(Continued)

*Primary Examiner*—Lynne A Gurley
*Assistant Examiner*—Galina Yushina
(74) *Attorney, Agent, or Firm*—Myers Bigel Sibley & Sajovec, P.A.

(57) ABSTRACT

A nonvolatile memory device includes a string selection gate and a ground selection gate on a semiconductor substrate, and a plurality of memory cell gates on the substrate between the string selection gate and the ground selection gate. First impurity regions extend into the substrate to a first depth between ones of the plurality of memory cell gates. Second impurity regions extend into the substrate to a second depth that is greater than the first depth between the string selection gate and a first one of the plurality of memory cell gates immediately adjacent thereto, and between the ground selection gate and a last one of the plurality of memory cell gates immediately adjacent thereto. Related fabrication methods are also discussed.

19 Claims, 9 Drawing Sheets

U.S. PATENT DOCUMENTS

| | | | |
|---|---|---|---|
| 6,365,457 B1 * | 4/2002 | Choi | 438/258 |
| 6,380,584 B1 * | 4/2002 | Ogawa | 257/315 |
| 6,744,097 B2 | 6/2004 | Yoo | |
| 6,858,906 B2 | 2/2005 | Lee et al. | |
| 2002/0008257 A1 * | 1/2002 | Barnak et al. | 257/262 |
| 2003/0047755 A1 * | 3/2003 | Lee et al. | 257/200 |
| 2006/0202263 A1 * | 9/2006 | Lee | 257/330 |
| 2006/0220098 A1 * | 10/2006 | Lee et al. | 257/315 |
| 2006/0239083 A1 * | 10/2006 | Lee | 365/185.28 |
| 2007/0001212 A1 * | 1/2007 | Lee et al. | 257/315 |

FOREIGN PATENT DOCUMENTS

| | | |
|---|---|---|
| JP | 09-148542 | 6/1997 |
| KR | 100155859 B1 | 7/1998 |
| KR | 100183855 B1 | 12/1998 |
| KR | 100193449 B1 | 2/1999 |
| KR | 1020020094354 A | 12/2002 |
| KR | 1020050068576 A | 7/2005 |
| KR | 1020060066389 A | 6/2006 |

OTHER PUBLICATIONS

Honda et al. Visualization using scanning nonlinear dielectric microscopy of electrons and holes localized in the thin gate film of a metal-SiO2-53N4-SiO2-semiconductor flash memory. Applied Physics Letters, 86 (2005), p. 013501-1-013501-3.*

S.M. Sze. Semiconductor Devices. Physics and Technoloty. 2nd edition, 2002, John Wiley & Sons, Inc. pp. 37-38, 507-510.*

Notice of Allowance corresponding to Korean Application No. 10-2006-0101949 mailed Mar. 6, 2008.

Chinese Office Action; Jun. 9, 2010; corresponding Chinese Application No. 200710181854.4 (12 pages).

* cited by examiner

NON-VOLATILE MEMORY DEVICES INCLUDING DOUBLE DIFFUSED JUNCTION REGIONS

CROSS-REFERENCE TO RELATED APPLICATION

This U.S. non-provisional patent application claims priority under 35 U.S.C. §119 from Korean Patent Application No. 10-2006-101949, filed on Oct. 19, 2006, the disclosure of which is hereby incorporated by reference herein in its entirety.

BACKGROUND OF THE INVENTION

The present invention relates to semiconductor memory devices, and more particularly, to nonvolatile semiconductor memory devices and methods of forming the same.

Nonvolatile memory devices may retain stored data even if the power supply is interrupted. The nonvolatile memory devices can be classified into NAND-type flash memory devices and NOR-type flash memory devices depending on a connection structure. In the NAND-type flash memory device, a string selection transistor SSL, a plurality of memory cell transistors and a ground selection transistor GSL may be connected in series. The string selection transistor may be connected to a bit line through a contact plug, and the ground selection transistor may be connected to a common source line CSL.

A programming procedure for the NAND-type flash memory device may include applying a voltage of 0V to a selected bit line, and applying a power supply voltage Vcc of 1.8V~3.3V to a gate of the string selection transistor. Accordingly a channel voltage of a cell transistor connected to the selected bit line may be 0V. A program voltage Vpgm may be applied to a selected word line such that electrons may be injected into the selected cell transistor by Fowler-Nordheim (FN) tunneling. A self-boosting method may be used in order to prevent the cell transistor connected to a non-selected bit line and the selected word line from being programmed.

A conventional self-boosting method may include applying a voltage of 0V to a gate of the ground selection transistor to interrupt a ground path. The power supply voltage Vcc may be applied to the non-selected bit line and a gate of the non-selected string selection transistor as a program inhibition voltage. The program voltage Vpgm may be applied to the selected word line and a pass voltage Vpass may be applied to the non-selected word line. Therefore, the channel voltage of the non-selected cell transistor may be boosted and it may be possible to prevent the non-selected cell transistor from being programmed. However, in the conventional self-boosting method, a leakage current may be generated in junction regions between the string selection transistor and memory cell transistor adjacent thereto, and between the ground selection transistor and the memory cell transistor adjacent thereto. Moreover, a gate induced drain leakage current (GIDL) and/or a band-to-band tunneling (BTBT) may be generated in the junction regions. Therefore, the self-boosting level may be reduced.

Meanwhile, in a conventional NAND-type flash memory, a soft program may occur due to hot carriers when applying the program inhibition voltage. The soft program caused by the hot carriers may frequently occur in the memory cell transistor most adjacent to the ground selection transistor. When applying the program inhibition voltage, the power supply voltage Vcc may be applied to the gate of the string selection transistor, but the voltage of 0V may be applied to the gate of the ground selection transistor. The ground selection transistor may have a channel voltage that may be different from the boosting voltage. Thus, the program phenomenon due to the hot carriers may take place in a memory cell transistor immediately adjacent to the ground selection transistor. That is, the soft program may occur in the immediately adjacent memory cell transistor.

SUMMARY OF THE INVENTION

Some embodiments of the present invention may provide nonvolatile memory devices including: a semiconductor substrate having device isolation regions thereon defining an active region therebetween; a string selection gate and a ground selection gate on the active region; a plurality of memory cell gates on the active region between the string selection gate and the ground selection gate; first impurity regions extending into the active region to a first depth in portions of the active region between ones of the plurality of memory cell gates; and second impurity regions extending into the active region to a second depth greater than the first depth in portions of the active region between the string selection gate and a first one of the plurality of memory cell gates immediately adjacent thereto, and in portions of the active region between the ground selection gate and a last one of the plurality of memory cell gates immediately adjacent thereto.

In some embodiments, the second impurity regions may be asymmetrically provided adjacent to edge portions of the string selection gate and the ground selection gate.

In other embodiments, the device may include a second string selection gate on the active region adjacent to the first string selection gate, and a second ground selection gate on the active region adjacent to the first ground selection gate. The second impurity regions may be additionally provided between the first and second string selection gates, and/or between the first and second ground selection gates.

In still other embodiments, the first impurity regions may be additionally provided in portions of the active region between the string selection gate and the first one of the plurality of memory cell gates, and between the ground selection gate and the last one of the plurality of memory cell gates.

According to further embodiments of the present invention, a method of fabricating a nonvolatile memory device includes: forming a string selection gate, a ground selection gate and a plurality of memory cell gates therebetween on an active region of a semiconductor substrate; forming first impurity regions extending into the active region to a first depth in portions of the active region between the string selection gate, the ground selection gate and the plurality of memory cell gates; and forming second impurity regions extending into the active region to a second depth greater than the first depth in portions of the active region between the string selection gate and a first one of the plurality of memory cell gates immediately adjacent thereto, and in portions of the active region between the ground selection gate and a last one of the plurality of memory cell gates immediately adjacent thereto.

According to other embodiments of the present invention, a NAND-type flash memory device includes first and second selection gate patterns on a substrate, and a plurality of memory cell gate patterns on the substrate between the first and second selection gate patterns. A plurality of source/drain regions are provided in portions of the substrate between the first and second selection gate patterns and ones of the plurality of memory cell gate patterns. Ones of the plurality of source/drain regions in portions of the substrate immediately adjacent to the first and/or second selection gate patterns extend into the substrate to a greater depth than ones of the plurality of source/drain regions in portions of the substrate between the plurality of memory cell gate patterns.

DETAILED DESCRIPTION OF EMBODIMENTS OF THE INVENTION

Figure 1:
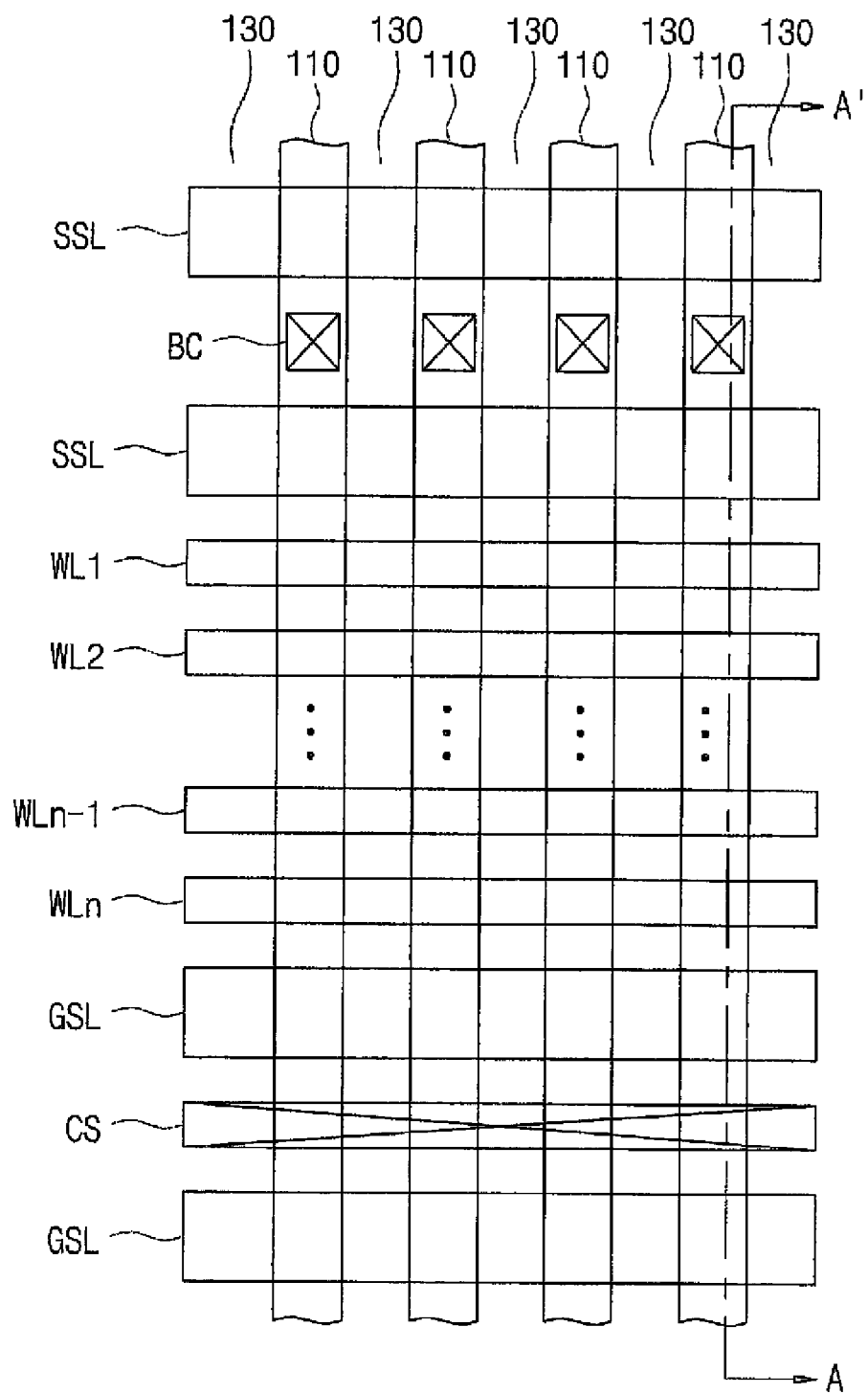
FIG. 1 is a plan view of a nonvolatile memory device according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, a nonvolatile memory device according to some embodiments of the present invention will be described with reference to FIGS. 1 and 2.

Figure 2:
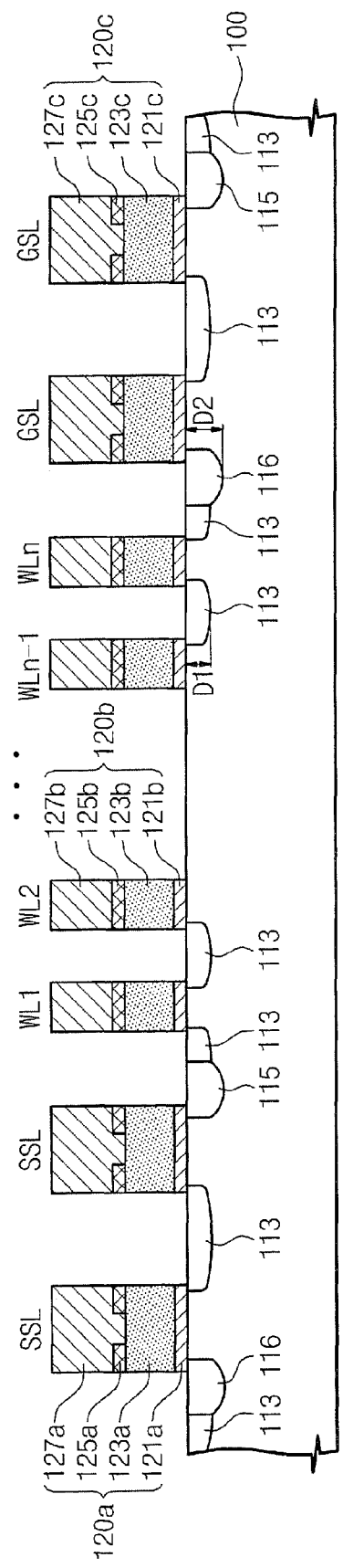
FIG. 2 is a cross-sectional view taken along line A-A' of FIG. 1, illustrating a nonvolatile memory device according to some embodiments of the present invention.

Referring to FIGS. 1 and 2, a device isolation layer 130 is disposed on a semiconductor substrate 100 to define a plurality of active regions 110. A string selection line SSL (also referred to herein as a string selection gate pattern) and a ground selection line GSL (also referred to herein as a ground selection gate pattern), which cross over the active regions 110, are arranged parallel with each other. A plurality of word lines WL1, WL2, WLn-1, WLn (also referred to herein as memory cell gate patterns) are arranged between the string selection line SSL and the ground selection line GSL. A contact plug BC is formed between the adjacent string selection transistors SSL to be electrically connected to a bit line (not shown). A common source line CSL is provided between the adjacent ground selection lines GSL.

The nonvolatile memory device according to some embodiments of the present invention includes a string selection transistor, a plurality of memory cell transistors and a ground selection transistor. The string selection transistor has a string selection gate 120a connected to the string selection line SSL. The plurality of memory cell transistors have memory gates 120b connected to the plurality of word lines, respectively. The ground selection transistor has a ground selection gate 120c connected to the ground selection line GSL. Impurity regions that may reduce and/or prevent leakage current are provided between the string selection line SSL and the word line immediately adjacent thereto, and between the ground selection line GSL and the word line immediately adjacent thereto.

Still referring to FIG. 2, the nonvolatile memory device according to some embodiments of the present invention includes the string selection gate 120a, the plurality of memory cell gates 120b and the ground selection gate 120c on the semiconductor substrate 100. The plurality of memory cell gates 120b are arranged between the string selection gate 120a and the ground selection gate 120c. Each of the plurality of memory cell gates 120b may include a tunnel insulating layer 121b, a charge storage layer 123b, a blocking dielectric layer 125b and a gate conductive layer 127b. The string selection gate 120a and the ground selection gate 120c may have a substantially similar structure as the plurality of cell gates 120b. That is, in some embodiments, the string selection gate 120a may include a tunnel insulating layer 121a, a charge storage layer 123a, a blocking dielectric layer 125a and a gate conductive layer 127a. Likewise, the ground selection gate 120c may include a tunnel insulating layer 121c, a charge storage layer 123c, a blocking dielectric layer 125c and a gate conductive layer 127c. The string selection gate 120a and the ground selection gate 120c may have a structure in which the charge storage layers 123a and 123c are electrically connected to the gate conductive layers 127a and 127c, respectively.

The semiconductor substrate 100 may include at least one layer selected from the group consisting of a single crystalline silicon layer, a silicon on insulator (SOI), a silicon layer formed on a silicon germanium (SiGe) layer, a silicon single crystalline layer formed on an insulating layer and a polysilicon layer formed on an insulating layer. Each of the tunnel insulating layers 121a, 121b and 121c may be a silicon thermal oxide layer formed by thermally oxidizing the semiconductor substrate 100. The charge storage layer may be a floating gate or a charge trap layer. The charge trap layer may include at least one layer selected from the group consisting of a silicon nitride layer ($Si_3N_4$), a nano crystalline silicon layer, a nano crystalline silicon germanium layer, a nano crystalline metal layer, an aluminum oxide layer ($Al_2O_3$), a hafnium oxide layer ($HfO_2$), a hafnium aluminum oxide layer (HfAlO) and a hafnium silicon oxide layer (HfSiO). The gate conductive layers 127a, 127b and 127c may include a material having a work function of 4.0 eV or more. The gate conductive layers, for example, may include at least one layer selected from the group consisting of a polysilicon layer, a tungsten nitride layer (WN), a titanium nitride layer (TiN), a tantalum nitride layer (TaN) and a molybdenum nitride layer (MoN). The blocking dielectric layers 125a, 125b and 125c are dielectric layers capable of blocking charges stored in the charge storage layers 123a, 123b and 123c from escaping into the gate conductive layers 127a, 127b and 127c. For example, the blocking dielectric layers may include at least one material selected from the group consisting of a silicon oxide, a silicon nitride, $Al_2O_3$, a hafnium aluminate, HfAlO, HfAlON, a hafnium silicate, HfSiO and HfSiON.

First impurity regions 113 are provided between the string selection gates, a plurality of the memory cell gates and the ground selection gates. The first impurity regions 113 may have an opposite conductivity type than that of the channel regions of the transistors. For example, when the channel regions are doped with P-type impurities, the first impurity regions 113 may be doped with N-type impurity ions. For example, the first impurity regions 113 may be doped with arsenic (As) ions. The first impurity regions 113 may have a first depth D1. Second impurity regions 115 and 116 are formed between the string selection gate SSL and the memory cell gate WL1 immediately adjacent thereto, and between the ground selection gate GSL and the memory cell gate WLn immediately adjacent thereto. The second impurity regions 115 and 116 may have a second depth D2 greater than the first depth D1 of the first impurity regions 113. The second impurity regions 115 and 116 may be doped with impurity ions such that the second impurity regions 115 and 116 have a lower impurity concentration than that of the first impurity regions 113. The second impurity regions 115 and 116 have the same conductivity type as the first impurity regions 113. For example, phosphorus (P) may be doped into the second impurity regions 115 and 116. The second impurity regions 115 and 116 may be asymmetrically provided adjacent to edge portions of the string selection and the ground selection gates, respectively. The second impurity regions 115 and 116 may further extend into the active regions under the string selection gates and the ground selection gates.

Figure 3:
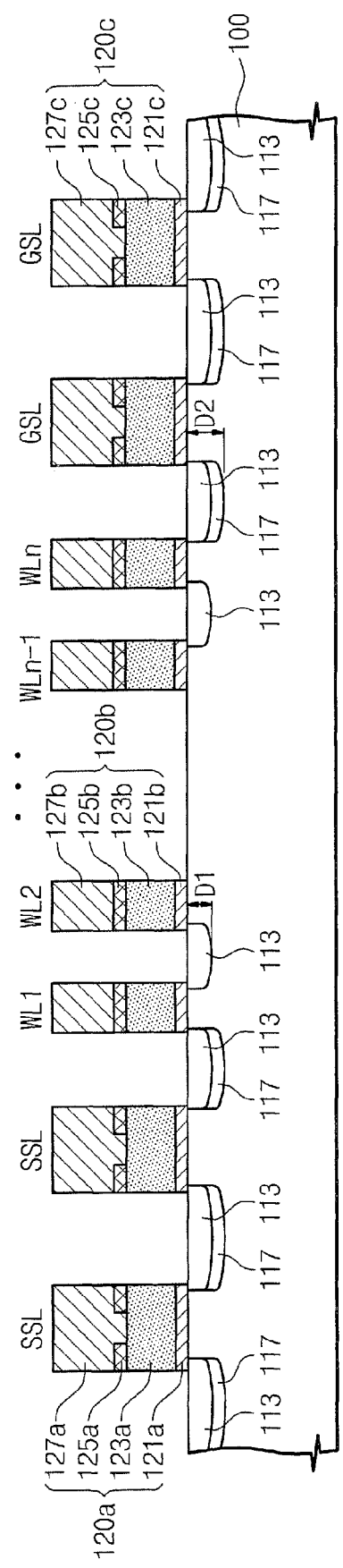
FIG. 3 is a cross-sectional view taken along line A-A' of FIG. 1, illustrating a nonvolatile memory device according to other embodiments of the present invention.

A nonvolatile memory device according to other embodiments of the present invention will be described below with reference to FIGS. 1 and 3. FIG. 3 is a cross-sectional view taken along line A-A' of FIG. 1.

Referring now to FIG. 3, a nonvolatile memory device according to other embodiments of the present invention includes a string selection gate 120a, a plurality of memory cell gates 120b and a ground selection gate 120c, which may have similar structures as those included in the nonvolatile memory device illustrated in FIG. 1.

First impurity regions 113 are provided between the string selection gates 120a, the plurality of memory cell gates 120b and the ground selection gates 120c. The first impurity regions 113 may have an opposite conductivity type to that of the channel regions of the transistors. For example, when the channel regions are doped with P-type impurities, the first impurity regions 113 may be doped with N-type impurity ions. For example, the first impurity regions 113 may be doped with arsenic (As) ions. The first impurity regions 113 may have a first depth D1. Second impurity regions 117 are provided between the string selection gates, between the ground selection gates, between the string selection gate and the memory cell gate WL1 immediately adjacent thereto, and between the ground selection gate and the memory cell gate WLn immediately adjacent thereto. The second impurity regions 117 may have a second depth D2 greater than the first depth D1 of the first impurity regions 113. The second impurity regions 117 may be doped with impurity ions such that the second impurity regions 117 may have a lower impurity concentration than that of the first impurity regions 113. The second impurity regions 117 may have the same conductivity type as the first impurity regions 113. For example, phosphorus (P) may be doped into the second impurity regions 117. The second impurity regions 117 may have substantially symmetrical structures.

Figure 4:
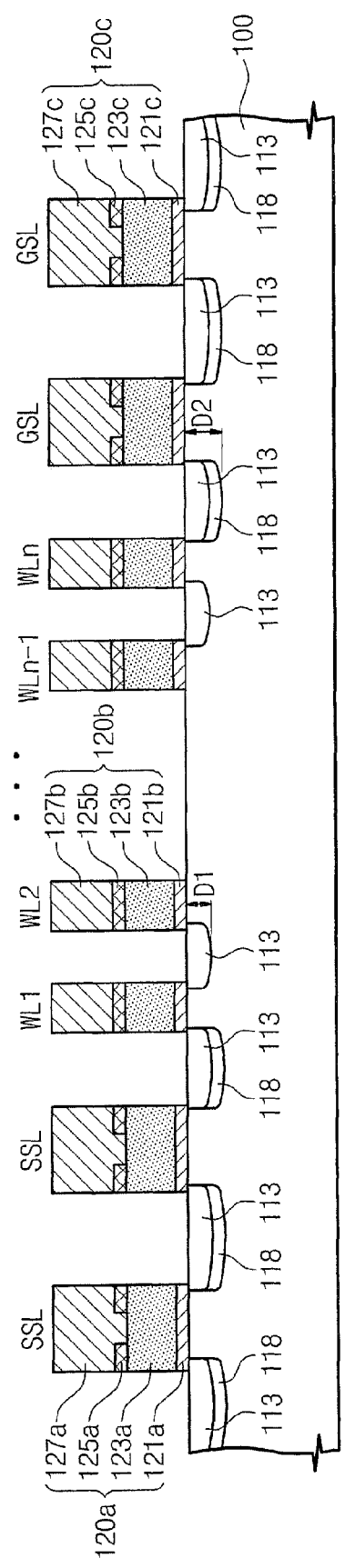
FIG. 4 is a cross-sectional view taken along line A-A' of FIG. 1, illustrating a nonvolatile memory device according to further embodiments of the present invention.

A nonvolatile memory device according to further embodiments of the present invention will be described below with reference to FIGS. 1 and 4. FIG. 4 is a cross-sectional view taken along line A-A' of FIG. 1.

Referring now to FIG. 4, a nonvolatile memory device according to further embodiments of the present invention includes a string selection gate 120a, a plurality of memory cell gates 120b and a ground selection gate 120c, which may have similar structures as those of the nonvolatile memory device illustrated in FIG. 1.

First impurity regions 113 are formed between the string selection gates 120a, the plurality of memory cell gates 120b and the ground selection gates 120c. The first impurity regions 113 may have an opposite conductivity type to that of the channel regions of the transistors. For example, when the channel regions are doped with P-type impurities, the first impurity regions 113 may be doped with N-type impurity ions, such as arsenic (As) ion. The first impurity regions 113 may have a first depth D1. Second impurity regions 118 are formed between the string selection gates, between the ground selection gates, between the string selection gate and the memory cell gate immediately adjacent thereto, and between the ground selection gate and the memory cell gate immediately adjacent thereto. The second impurity regions 118 may have a second depth D2 greater than the first depth D1 of the first impurity regions 113. The second impurity regions 118 may be doped with impurity ions such that the second impurity regions 118 may have a lower impurity concentration than that of the first impurity regions 113. The second impurity regions 118 have the same conductivity type as the first impurity regions 113. For example, phosphorus (P) may be doped into the second impurity regions 118. The second impurity regions 118 may have a substantially symmetrical structure. In addition, as shown in FIG. 4, the second impurity regions 118 may further extend into portions of the active regions under the string selection gates 120a and/or the ground selection gates 120c.

Methods of fabricating nonvolatile memory devices according to some embodiments of the present invention will be described below with reference to FIGS. 5 through 7.

Figure 5:
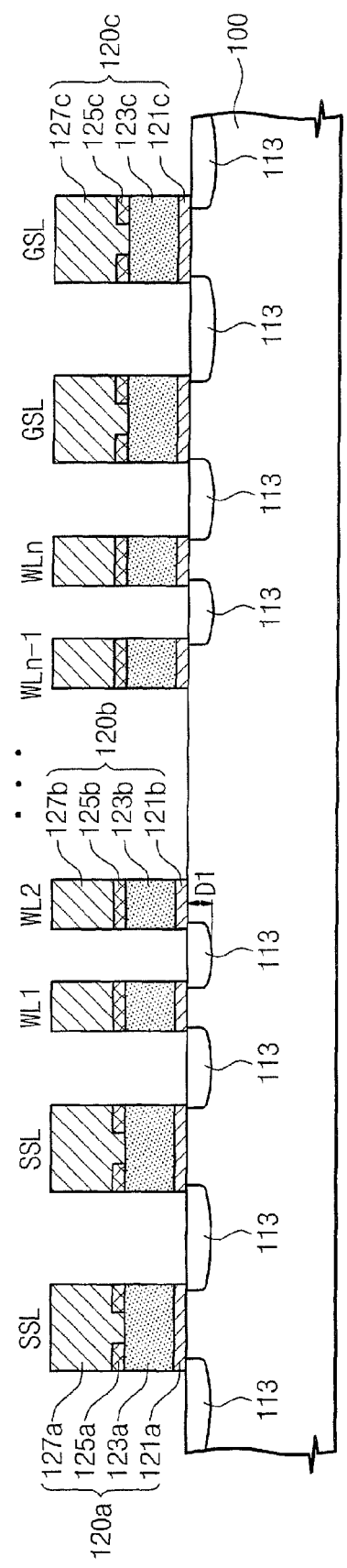
FIGS. 5 through 7 are cross-sectional views taken along line A-A' of FIG. 1, illustrating a method of forming a nonvolatile memory device according to some embodiments of the present invention.

Referring to FIG. 5, a string selection gate 120a, a plurality of memory cell gates 120b and a ground selection gate 120c are formed on a semiconductor substrate 100. Each of the plurality of memory cell gates 120b may include a tunnel insulating layer 121b, a charge storage layer 123b, a blocking dielectric layer 125b and a gate conductive layer 127b. The string selection gate 120a and the ground selection gate 120c may have similar structures as the plurality of memory cell gates 120b. The string selection gate 120a and the ground selection gate 120c may have structures in which the charge storage layers 123a and 123c are electrically connected to the gate conductive layers 127a and 127c. An additional conductive layer (not shown) may be formed on the gate conductive layers 127a, 127b and 127c. A hard mask layer (not shown) may also be formed on the additional conductive layer. The additional conductive layer may include a metal layer and a metal silicide layer.

The semiconductor substrate 100 may include at least one layer selected from the group consisting of a single crystalline silicon layer, a silicon on insulator (SOI), a silicon layer formed on a silicon germanium (SiGe) layer, a silicon single crystalline layer formed on an insulating layer and a polysilicon layer formed on an insulating layer. Each of the tunnel insulating layers 121a, 121b and 121c may be a silicon thermal oxide layer formed by thermally oxidizing the semiconductor substrate 100. The charge storage layer may be a floating gate or a charge trap layer. The charge trap layer may include at least one layer selected from the group consisting of a silicon nitride layer ($Si_3N_4$), a nano crystalline silicon layer, a nano crystalline silicon germanium layer, a nano crystalline metal layer, an aluminum oxide layer ($Al_2O_3$), a hafnium oxide layer ($HfO_2$), a hafnium aluminum oxide layer (HfAlO) and a hafnium silicon oxide layer (HfSiO). The gate conductive layers 127a, 127b and 127c may include a material having a work function of 4.0 eV or more. The gate conductive layers may include at least one layer selected from the group consisting of a polysilicon layer, a tungsten nitride layer (WN), a titanium nitride layer (TiN), a tantalum nitride layer (TaN) and a molybdenum nitride layer (MoN). The blocking dielectric layers 125a, 125b and 125c are dielectric layers capable of blocking charges stored in the charge storage layers 123a, 123b and 123c from escaping into the gate conductive layers. The blocking dielectric layer 125a, 125b and 125c may include a material having a dielectric constant greater than that of the tunnel insulating layers. For example, the blocking dielectric layers may include at least one material selected from the group consisting of a silicon oxide, a silicon nitride, $Al_2O_3$, a hafnium aluminate, HfAlO, HfAlON, a hafnium silicate, HfSiO and HfSiON.

The first impurity regions 113 are formed between the string selection gate, the plurality of memory cell gates and the ground selection gate by ion implantation. The first impurity regions 113 may have an opposite conductivity type to that of the channel regions. For example, when the channel regions are doped with P-type impurities, the impurity regions 113 may be implanted with N-type impurity ions, such as arsenic (As) ions and/or phosphorus (P) ions. The first impurity regions 113 are formed to a first depth D1.

Figure 6:
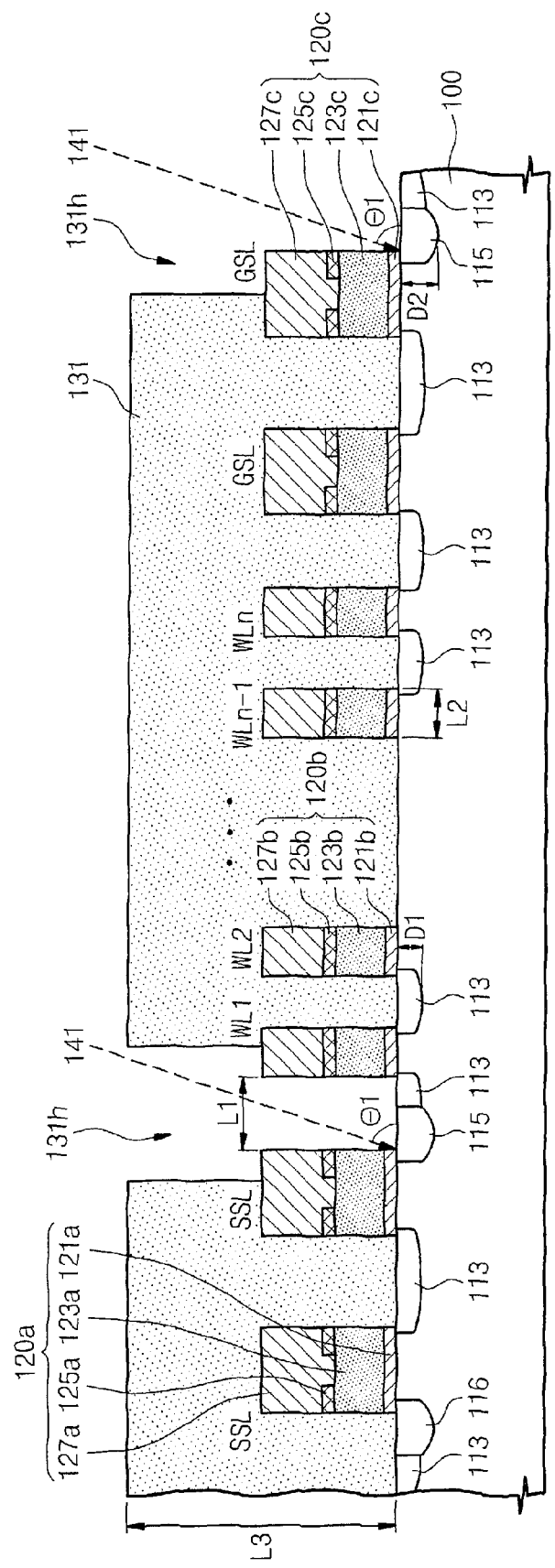
Figure 7:
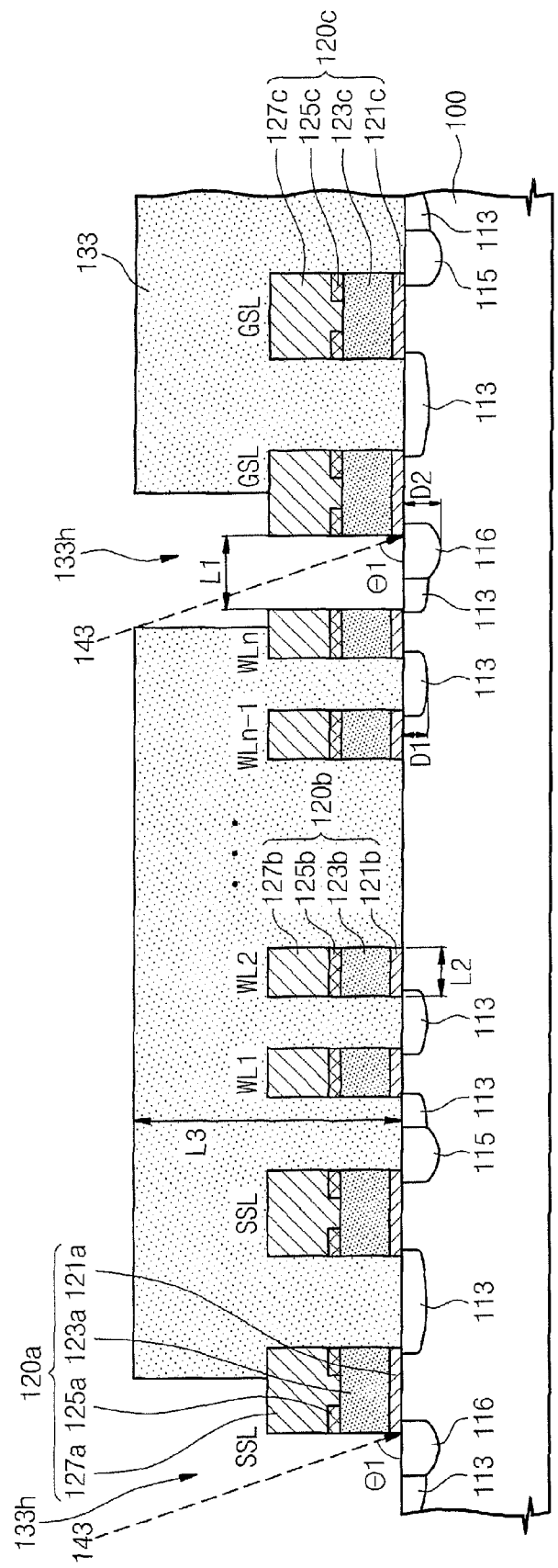

Referring to FIGS. 6 and 7, second and third impurity regions 115 and 116 having a second depth D2 greater than the first depth D1 are formed in junction regions of the string and ground selection transistors 120a and 120b adjacent to the plurality of memory cell gates 120b. In particular, the second and third impurity regions 115 and 116 are formed between the string selection gate and the memory cell gate immediately adjacent thereto, and between the ground selection gate and the memory cell gate immediately adjacent thereto.

The second impurity regions 115 are formed as discussed below with reference to FIG. 6. For example, a first photoresist pattern 131 may be formed having first openings 131h exposing portions of the active region between a memory gate at one end of a group of the plurality of memory cell gates and a string selection gate immediately adjacent thereto, and/or between a memory gate at one end of a group of another plurality of memory cell gates and the ground selection gate immediately adjacent thereto. The one end of the group of the plurality of word lines may correspond to a left side in the drawings. Likewise, the other end of the group of the plurality of word lines may correspond to a right side in the drawings. A first tilt-angle ion implantation process 141 is performed by implanting impurity ions having the same conductivity type as those in the first impurity regions 113 using the first photoresist patterns 131 as a mask. For instance, phosphorus (P) ions may be implanted into the second impurity regions 115. The first tilt-angle ion implantation process 141 may be performed as follows. For example, the first tilt-angle ion implantation process 141 may be performed by implanting the impurity ions toward the one end of the memory cell gate from the other end opposite to the one end at a predetermined tilt angle. Therefore, the second impurity regions 115 may be asymmetrically formed adjacent to edge portions of the string selection gate and the ground selection gate. The second impurity regions 115 may be doped with impurity ions such that the second impurity regions 115 have a lower concentration than that of the first impurity regions 113.

Referring to FIG. 7, the first photoresist pattern 131 is removed, and third impurity regions 116 are then formed. The third impurity regions 116 may be formed by the below-described process. For example, after removing the first photoresist pattern 131, a second photoresist pattern 133 is formed having second openings 133h exposing portions of the active regions between a memory cell gate at the other end of the group of the plurality of memory cell gates and the ground selection gate immediately adjacent thereto, and/or between a memory cell gate at the other end of another group of a plurality of memory cell gates and the string selection gate immediately adjacent thereto. A second tilt-angle ion implantation process 143 is performed by implanting impurity ions having the same conductivity type as those of the first impurity regions 113 using the second photoresist patterns 133 as a mask. For instance, phosphorus (P) ions may be implanted into the third impurity regions 116. The second tilt-angle ion implantation process 143 may be performed as follows. For example, the second tilt-angle ion implantation process 143 may be performed by implanting the impurity ions from the one end of the memory cell gate structure toward the other end thereof at a predetermined tilt angle. The third impurity regions 116 are asymmetrically formed adjacent to edge portions of the string selection gates and the ground selection gates. The third impurity regions 116 may be doped with impurity ions such that the third impurity regions 116 have a lower impurity concentration than that of the first impurity regions 113. Accordingly, the plurality of memory cell gates are arranged in a string configuration along one direction (for example, from WL1 to WLn). As such, it will be understood that a memory cell gate at the one end of the memory gate structure may be a memory cell gate connected to the word line WL1, and a memory cell gate of the other end may be a memory cell gate connected to the word line WLn, or vice versa.

Again referring to FIGS. 6 and 7, in the first and second tilt-angle ion implantation processes 141 and 143 used to form the second and third impurity regions 115 and 116, L3 is defined as a height of the first and second photoresist patterns 131 and 133. L1 is defined as a space between the string selection gate and the memory cell gate adjacent thereto and between the ground selection gate and the memory cell gate adjacent thereto. L2 is defined as a width of the memory cell gates. Thus, the ion implantation may be performed at a tilt angle θ1, where $90° \geq θ1 \geq \tan^{-1}(L3/(L1+L2/2))$ with respect to the semiconductor substrate. This tilt angle θ1 may be calculated in consideration that the first and second photoresist patterns 131 and 133 cover about half of an upper surface of the memory cell gates immediately adjacent to the string selection gate and the ground selection gate, respectively. The second and third impurity regions 115 and 116 may extend into portions of the active region under the string selection gates and the ground selection gates.

Hereinafter, a method of forming a nonvolatile memory device according to other embodiments of the present invention will be described with reference to FIGS. 5 and 8.

The gates and the first impurity regions 113 may have similar structures as described with reference to FIG. 5.

Figure 8:
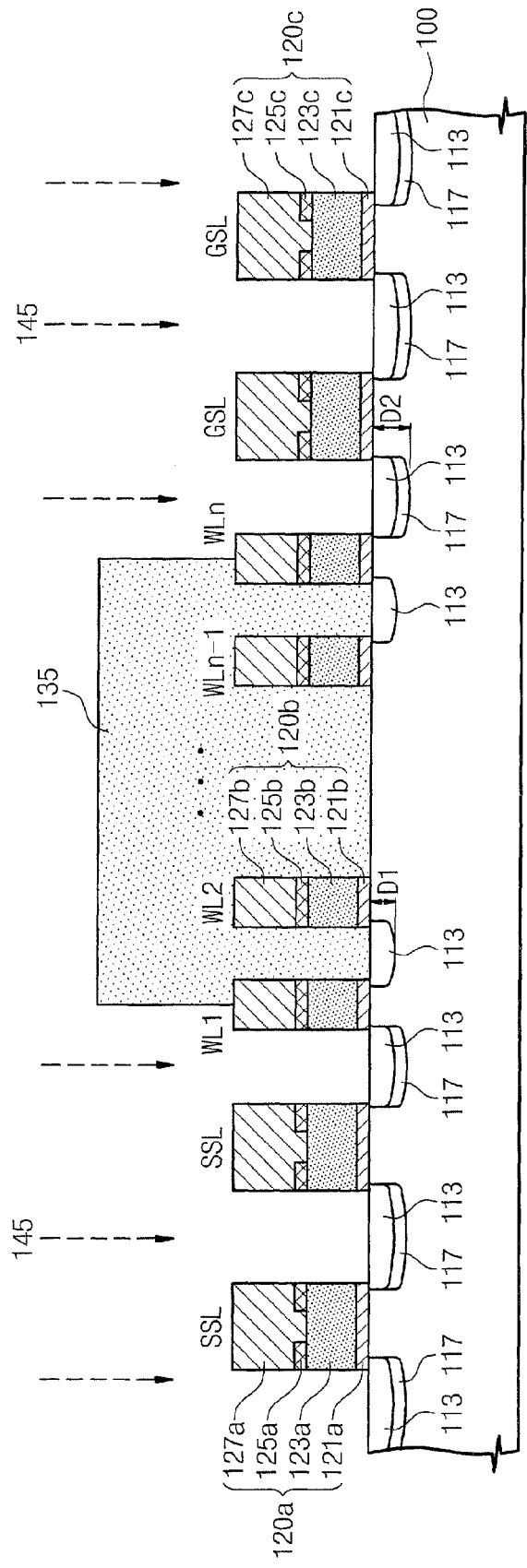
FIG. 8 is a cross-sectional view taken along line A-A' of FIG. 1, illustrating a method of forming a nonvolatile memory device according to other embodiments of the present invention.

Referring now to FIG. 8, the second impurity regions 117 are formed between the ground selection gate and the memory cell gate WLn immediately adjacent thereto, between the string selection gate and the memory cell gate WL1 immediately adjacent thereto, between the string selection gates 120a adjacent to each other, and between the ground selection gates 120c adjacent to each other. The second impurity regions 117 have the second depth D2 greater than the first depth D1 of the first impurity regions 113.

The second impurity regions 117 may be formed as described below. For example, a photoresist pattern 135 is formed covering junction regions between the plurality of memory cell gates 120b and exposing junction regions adjacent to the string selection gate 120a and the ground selection gate 120c. An ion implantation process 145 is performed using the photoresist patterns 135 as a mask. The ion implantation process may be performed with predetermined implantation energy such that the second impurity regions 117 have the second depth D2. The second impurity regions 117 may be doped with impurity ions such that the second impurity regions 117 have a lower impurity concentration than that of the first impurity regions 113. For example, phosphorus (P) ions may be implanted into the second impurity regions 117. The ion implantation process 145 may include vertically implanting impurity ions having the same conductivity type as the first impurity regions 113 into the semiconductor substrate.

Hereinafter, a method of forming a nonvolatile memory device according to further embodiments of the present invention will be described with reference to FIGS. 5 and 9.

The gates and the first impurity regions 113 may have similar structures and/or may be formed by similar processes as described with reference to FIG. 5.

Figure 9:
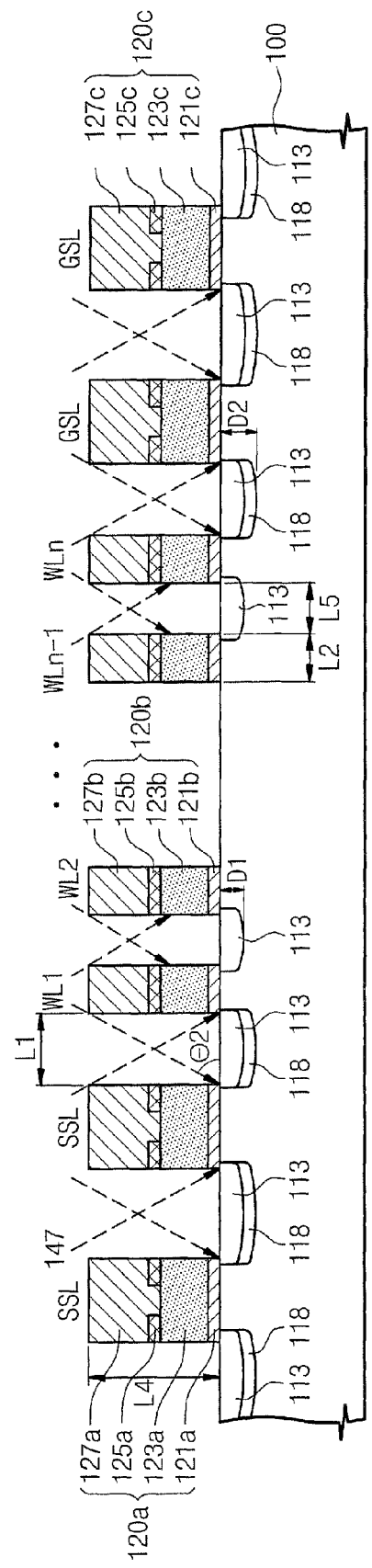
FIG. 9 is a cross-sectional view taken along line A-A' of FIG. 1, illustrating a method of forming a nonvolatile memory device according to further embodiments of the present invention.

Referring now to FIG. 9, the second impurity regions 118 are formed between the ground selection gate and the memory cell gate WLn immediately adjacent thereto, between the string selection gate and the memory cell gate WL1 immediately adjacent thereto, between the string selection gates 120a adjacent to each other, and between the ground selection gates 120c adjacent to each other. The second impurity regions 118 have the second depth D2 greater than the first depth D1 of the first impurity regions 113.

The second impurity regions 118 may be formed as follows. For example, impurity ions having the same conductivity type as those of the first impurity regions 113 may be implanted at such a tilt angle θ2 that the impurity ions cannot be implanted into junction regions between the plurality of memory cell gates 120b. The tilt angle θ2 may be calculated based on the greater distance between the selection gates and the immediately adjacent memory cell gates WL1 and WLn than between adjacent memory cell gates. Thus, additional photoresist patterns may not be required. The second impurity regions 118 may be doped with impurity ions such that the second impurity regions 118 may have a lower concentration than that of the first impurity regions 113. For example, phosphorus (P) ions may be implanted into the second impurity regions 118.

A space L5 between each of the memory cell gates 120b is smaller than spaces L1 between the string selection gate and the memory cell gate WL1 immediately adjacent thereto and between the ground selection gate and the memory cell gate WLn immediately adjacent thereto. Therefore, ions implanted at a predetermined tilt angle are not implanted into the junction regions between the plurality of memory cell gates 120b, which are shielded by the memory cell gates. For example, when a height measured from the semiconductor substrate to the memory cell gates is assumed to be L4, the tilt angle θ2 may be about $\tan^{-1}(L4/L5) \geq θ2 \geq \tan^{-1}(L4/L1)$. The second impurity regions 118 may extend into portions of the active regions under the string selection gates and the ground selection gates.

According to some embodiments of the present invention as described above, the source/drain junction regions between the plurality of memory cell gates are shallowly maintained, and the source/drain junction regions between the string selection transistor and the ground selection transistor have a double diffused drain (DDD) structure, thereby reducing and/or preventing short-channel effects and/or a "soft" program caused by hot carrier effects when applying a program inhibition voltage to a non-selected string. Also, a boosting level may be stably controlled to increase program efficiency.

While the present invention has been particularly shown and described with reference to preferred embodiments thereof, it will be understood by those skilled in the art that various changes in form and details may be made therein without departing from the spirit and scope of the invention as defined by the appended claims.

That which is claimed:

1. A nonvolatile memory device, comprising:
   a semiconductor substrate including device isolation regions thereon defining an active region therebetween;
   a plurality of selection gates comprising a string selection gate and a ground selection gate on the active region of the substrate;
   a plurality of memory cell gates on the active region between the string selection gate and the ground selection gate;
   first impurity regions extending into the active region to a first depth in portions of the active region between ones of the plurality of memory cell gates and in portions of the active region between the plurality of memory cell gates and the plurality of selection gates; and
   second impurity regions extending into the active region to a second depth greater than the first depth in the portions of the active region between the plurality of memory cell gates and the plurality of selection gates,
   wherein an entirety of a surface of the active region extending from first and last ones of the plurality memory cell gates to ones of the plurality of selection gates immediately adjacent thereto is coplanar with a surface of the active region including the plurality of memory cell gates thereon, and
   wherein the first impurity regions have a greater impurity concentration than the second impurity regions.

2. The nonvolatile memory device of claim 1, wherein the second impurity regions are asymmetrically provided adjacent to edge portions of the string selection gate and the ground selection gate.

3. The nonvolatile memory device of claim 2, wherein the second impurity regions further extend under the edge portions of the string selection gate and the ground selection gate.

4. The nonvolatile memory device of claim 1, further comprising:
   a second string selection gate on the active region adjacent to the first string selection gate,
   wherein the second impurity regions extend into the active region to the second depth between the first and second string selection gates.

5. The nonvolatile memory device of claim 1, further comprising:
   a second ground selection gate on the active region adjacent to the first ground selection gate,
   wherein the second impurity regions extend into the active region to the second depth between the first and second ground selection gates.

6. The nonvolatile memory device of claim 1, wherein the surface of the active region extending from the first and last ones of the plurality memory cell gates to the ones of the plurality of selection gates comprises a first substantially planar surface continuously extending from under the string selection gate to under the first one of the plurality of memory cell gates, and a second substantially planar surface continuously extending from under the ground selection gate to under the last one of the plurality of memory cell gates, wherein the first and second substantially planar surfaces are coplanar with the surface of the active region including the plurality of memory cell gates thereon.

7. The nonvolatile memory device of claim 1, wherein each of the plurality of memory cell gates includes a tunnel insulating layer, a charge storage layer, a dielectric layer and a gate conductive layer.

8. The nonvolatile memory device of claim 7, wherein the gate conductive layer includes a material having a work function of about 4 eV or more.

9. The nonvolatile memory device of claim 7, wherein the dielectric layer includes a material having a dielectric constant greater than that of the tunnel insulating layer.

10. The nonvolatile memory device of claim 1, wherein ones of the plurality of memory cell gates includes a charge storage layer and a gate conductive layer, and wherein the charge storage layer includes at least one layer selected from the group consisting of a silicon nitride layer, a nano crystalline silicon layer, a nano crystalline silicon germanium layer, a nano crystalline metal layer, an aluminum oxide layer, a hafnium oxide layer, a hafnium aluminum oxide layer, and a hafnium silicon oxide layer.

11. The nonvolatile memory device of claim 1, wherein the first impurity regions include impurity ions having an opposite conductivity type than that of the substrate.

12. The nonvolatile memory device of claim 1, wherein the first impurity regions comprise arsenic ions, and wherein the second impurity regions comprise phosphorus ions.

13. The nonvolatile memory device of claim 1, wherein the semiconductor substrate comprises at least one selected from the group consisting of a single crystalline silicon layer, SOI (silicon on insulator), a silicon layer formed on silicon germanium layer, a silicon single crystalline layer formed on an insulating layer, and a polysilicon layer formed on an insulating layer.

14. The nonvolatile memory device of claim 1, wherein the surface of the active region at midpoints between the first and last ones of the plurality memory cell gates and the ones of the plurality of selection gates immediately adjacent thereto has a substantially same height as the surface of the active region between the plurality of memory cell gates.

15. The nonvolatile memory device of claim 1, wherein respective widths of the plurality of selection gates are greater than respective widths of the plurality of memory cell gates.

16. The nonvolatile memory device of claim 1, wherein the plurality of selection gates comprises a plurality of string selection gates and a plurality of ground selection gates.

17. The nonvolatile memory device of claim 1, wherein the surface of the active region extending from the first and last ones of the plurality memory cell gates to the ones of the plurality of selection gates and the surface of the active region including the plurality of memory cell gates thereon comprises a same substantially planar surface including the plurality of selection gates and the plurality of memory cell gates thereon.

18. A NAND-type flash memory device, comprising:

first and second selection gate patterns on a substrate;

a plurality of memory cell gate patterns on the substrate between the first and second selection gate patterns; and a plurality of source/drain regions in portions of the substrate between the first and second selection gate patterns and first and last ones of the plurality of memory cell gate patterns, and in portions of the substrate between ones of the plurality of memory cell gate patterns, wherein ones of the plurality of source/drain regions in portions of the substrate immediately adjacent to the first and second selection gate patterns extend into the substrate to a greater depth than ones of the plurality of source/drain regions in the portions of the substrate between the ones of the plurality of memory cell gate patterns, wherein an entirety of a surface of the substrate extending from the first and second selection gate patterns to the first and last ones of the plurality memory cell gate patterns immediately adjacent thereto is coplanar with a surface of the substrate including the plurality of memory cell gate patterns thereon, and wherein the ones of the plurality of source/drain regions in the portions of the substrate between the ones of the plurality of memory cell gate patterns have a greater impurity concentration than the ones of the plurality of source/drain regions immediately adjacent to the first and second selection gate patterns.

19. A nonvolatile memory device, comprising:

a semiconductor substrate including device isolation regions thereon defining an active region therebetween;

a plurality of selection gates comprising a string selection gate and a ground selection gate on the active region of the substrate;

a plurality of memory cell gates on the active region between the string selection gate and the ground selection gate;

first impurity regions extending into the active region to a first depth in portions of the active region between ones of the plurality of memory cell gates and in portions of the active region between the plurality of memory cell gates and the plurality of selection gates; and second impurity regions extending into the active region to a second depth greater than the first depth in the portions of the active region between the plurality of memory sell gates and the plurality of selection gates, wherein the first impurity regions have a greater impurity concentration than an entirety of the second impurity regions, wherein the plurality of selection gates respectively include tunnel insulation layers, and wherein the tunnel insulation layers extend partially onto ones of the second impurity regions adjacent thereto.

* * * * *